INSULATING GATE THIN FILM TRANSISTOR HAVING
A THIN INSULATING LAYER OVERLAPPING
A THICK INSULATING LAYER

Filed June 30, 1965 2 Sheets-Sheet 1

INVENTORS.
ROBERT I. FRANK
JOHN G. SIMMONS
BY
Carl Fissell Jr.
AGENT

INVENTORS.
ROBERT I. FRANK
JOHN G. SIMMONS
BY Carl Fissell Jr.
AGENT 3,320,499
Patented May 16, 1967

3,320,499

INSULATING GATE THIN FILM TRANSISTOR HAVING A THIN INSULATING LAYER OVERLAPPING A THICK INSULATING LAYER

Robert I. Frank, Concord, Mass., and John G. Simmons, Harlow, England, assignors to Burroughs Corporation, Detroit, Mich., a corporation of Michigan
Filed June 30, 1965, Ser. No. 468,461
4 Claims. (Cl. 317—235)

This invention relates to thin film transistor manufacturing techniques, and, more particularly, although not necessarily exclusively, to a thin film transistor fabricating technique for arranging or positioning the control elements for the structure extremely close together so as to provide a relatively high degree of control and gain therefor. With still more specificity the present invention has to do with a novel method of manufacture, not heretofore known, wherein it is possible to readily, easily, cheaply and efficiently produce thin film transistors with precise and substantially identical control, transconductance characteristics, with a minimum of registration problems and with sufficient ease and facility so that the method may be practiced by those not readily skilled in the art.

In accordance therewith, it is an important object of the present invention to provide a new and novel method of fabrication for providing thin film transistors of high transconductance.

Still another object of the invention is to provide a method of thin film transistor fabrication which requires less precise registration of the masking structures used to produce the device enabling an unskilled individual to apply the method easily, simply and efficiently.

Another object of the invention is to provide a method of fabrication of thin film transistors in which the source and drain are very closely spaced effectively providing high gain and exceptionally good control over current flow in the device.

It is also an object of the invention to provide as a new article of manufacture a thin film transistor having high gain and control of internal current flow.

Another object of the invention is to permit the use of gate electrodes of considerably larger width than the source-drain spacing without significant loss of high frequency performance which would ordinarily be expected from the utilization of a wider gate.

Still a further object of the invention is to reduce the possibility of dielectric break-down between the gate and source or drain electrodes in the area where the insulating layer crosses the edges of the source and drain electrodes.

In accordance with the foregoing objects and first briefly described, the present invention comprises a method of manufacture wherein a semiconductor body is disposed upon a substrate, such, for example, as glass. Thereafter, by means of suitable masks, electrically conductive contact connectors or pads are oriented and arranged peripherally of the supporting structure to provide interconnecting means for electrically, operably connecting the device with associated utilization apparatus. Source and drain electrodes are then deposited through a mask carrying an extremely small diameter wire thus to provide an exceedingly narrow source-drain spacing and a small degree of overlap of the source and drain with the semiconductor member while simultaneously connecting both the source and drain to respective connector pads on the substrate. A relatively thick body of insulating material is then deposited through the mask, after which the mask is removed and a relatively thin insulator is deposited over the thick insulating body. Finally a gate electrode is deposited over the thick insulator in a manner permitting a portion of this latter electrode to be disposed intermediate the source and drain while portions of the electrode overlap the source and drain. The gate electrode includes a portion thereof for interconnecting this latter electrode into a utilization circuit.

These and other objects and advantages of the present method and apparatus will be more apparent from a reading of the specification and associated claims when taken together with the accompanying drawings wherein:

Figure 1:
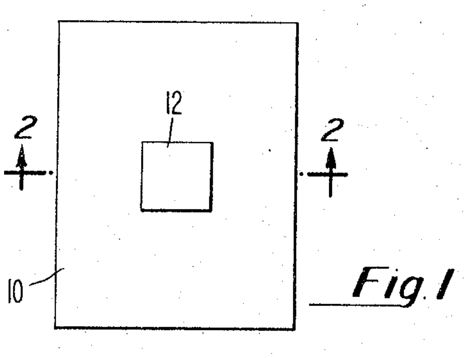
FIGURE 1 is a plan view drawn to an enlarged and exaggerated scale of a substrate with a body of semiconductor material thereon.
Figure 2:
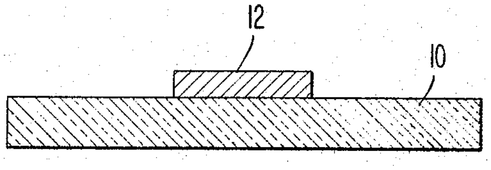
FIGURE 2 is a sectional view along the line 2—2 of FIGURE 1.

The present application is directed to a thin film transistor and to a novel method of manufacture of such apparatus. In the literature dealing with this type of device, source-drain spacings of as little as 0.4 mil have been reported. Gate widths of about the same size also have been reported.

In order to obtain increased high-frequency performance, it is desirable to have the source-drain spacing as small as possible, and a gate of about the same width (as the source-drain spacing), which does not overlap the source and drain electrodes. However, the alignment of the gate with the source-drain slot which results from the spacing between the source and the drain becomes increasingly difficult as this spacing (slot size) is decreased or narrowed.

For example, alignment of a .15 mil gate electrode with a .1 mil slot (with slight gate overlap) requires plus or minus 0.05 mil or 1.25$\mu$ registration. Such registration requires extremely sophisticated alignment methods and techniques. In addition, removal of the device from the vacuum system for such alignment is required, inasmuch as there is no known efficient apparatus permitting such extreme high tolerances within the vacuum chamber.

The present method of manufacture discloses a novel technique for overcoming the gate size and gate alignment problems encountered when using very small source-to-drain spacings in thin film transistors. As hereinafter discussed in detail, an improved, relatively simple, but extremely efficient technique is obtained by the approach subsequently described.

As hereinafter described, the present method includes the insertion of a relatively thick insulating layer over the source and the drain, in addition to the thin gate insulator which was present before. This thick insulator produces several important effects.

First, it allows present day registration methods to be used without sacrificing frequency response when using relatively small source-drain spacings. This is due to the reduction in capacitance of the overlapping region. A numerical calculation set forth hereinafter shows this:

For the type of device considered herinafter the analysis used by Weimer in "Physics of Thin Films," vol. 2, pages 159–164, is appropriate with one modification due to the difference in structure over the Weimer device and that of the present invention. Weimer takes the gate electrode width as equal to the source-drain spacing L. This is an idealized model, since in any real device there will of necessity be some overlap of the gate electrode onto the source and drain regions. In the device considered here, gate overlap has been intentionally introduced. Thus in both a real Weimer type device and in the structure concerned herein it is necessary to take into consideration the extra capacitance introduced by the gate overlap. The only capacitance considered by Weimer in his analysis is that due to a non-overlapping gate designated $C_g$. Using the usual formula for parallel plate capacitance we may write $$C_g=\frac{\epsilon_o KwL}{t}$$

where $\epsilon_0$=permittivity of free space,
$K$=relative dielectric constant of the insulator,
$w$=the channel width,
$L$=the source-drain spacing, and
$t$=the insulator thickness.

The additional capacitance introduced by the gate overlap may be designated $C_g'$. In a Weimer device, the insulator thickness is uniform, and the extra capacitance may be written $$C_g'=\frac{\epsilon_o KwL'}{t}$$

where L′ is the length of the overlap region. In the structure considered here, the insulator is thicker in the overlap region, hence the extra capacitance is given by $$C_g'=\frac{\epsilon_o wKL'}{t'}$$

where $t'$ is the thickness of the insulator in the overlap region.

The gate capacitance enters into the analysis in two places. In the first case Equation 1, page 160 of the above mentioned reference, the capacitance of interest is just that due to the non-overlapping part of the gate, $C_g$. This is because only the mobile carriers in the channel between source and drain are of importance in calculating the current. In the second case, Equation 18, page 164 of the Weimer reference, however, it is the total input capacitance that is required, and this includes both $C_g$ and $C_g'$.

Thus Equation 18 becomes $$G\cdot Bw\approx\frac{gm}{2\pi(C_g+C_g')}$$

and Equation 19 becomes $$G\cdot Bw\approx\frac{\mu_d V_d C_g}{2\pi L^2(C_g+C_g')}=\frac{\mu_d V_d C_g}{2\pi L^2 C_{TOT}}$$

Since the gain bandwidth product characterizes the frequency response of the device, it is this last equation that interests us here. The larger the gain bandwidth product, the greater the frequency response. We will now calculate typical gain bandwidth products for a Weimer type device and for the structure considered in the subject application, and show that the proposed structure gives comparable or better frequency response, without requiring the precise registration of Weimer's method.

(1) Weimer device width $L$=0.1 mil
$t$=1000 A.=$10^{-5}$ cm.
$L'$=1μ=.04 mil

Weimer states that 1μ alignment is possible, and thus this figure has been used for L′, the gate overlap, giving a gate width of 0.14 mil.

$$C_{TOT}=C_g+C_g'=\epsilon_o Kw\left(\frac{L}{t}+\frac{L'}{t}\right)$$

$$=\epsilon_o Kw\frac{L+L'}{t}$$

$$G\cdot Bw=\frac{\mu dVdCg}{2\pi L^2 C_{TOT}}=\frac{\mu dVd}{2\pi}\frac{\epsilon_o Kw(L/t)}{\epsilon_o KwL^2\left(\frac{L+L'}{t}\right)}$$

$$=\frac{\mu dVd}{2\pi(1.4\times10^{-6})}$$

(2) The proposed device $L$=0.1 mil
$t$=$10^{-5}$ cm.
$t'$=$10^{-4}$ cm.
$L'$=0.3 mil The total gate width, L+L′, is 0.4 mil allowing plenty of overlap and ease of registration.

$$Cg+Cg'=\epsilon_o kw\left(\frac{L}{t}+\frac{L'}{t'}\right)$$

$$G\cdot B=\omega\frac{\mu dVd^{\epsilon_o kw}(L/t)}{2\pi L^2\left(\frac{L}{t}+\frac{L'}{t'}\right)^{\epsilon_o kw}}=\frac{\mu dVd}{2\pi L^2\left(1+\frac{L}{t}\frac{t}{t'}\right)}$$

$$=\frac{\mu dVd}{2\pi(1.3\times10^{-6})}$$

Thus the proposed device has a gain bandwidth product of 14/13 that of the Weimer device, or about 8% greater than the Weimer device and is much simpler to make, because of the large gate dimension. Note that if a 0.4 mil gate width were used in the Weimer device, we would have $$G\cdot Bw=\frac{\mu dVd}{2\pi(4\times10^{-6})}$$

or roughly only ⅓ as much as the proposed device.

Second, it reduces the possibility of breakdown between the gate and the source or drain in the overlap regions. That is to say, some overlap is present in the usual method and this region is the most likely place where the breakdown will occur, since the file is registered there. With the disclosed method, this possibility is thus greatly reduced. And, finally, it reduces the effect of charge migration laterally out from the gate electrode, that is, across the top surface of the insulator, thus improving the overall stability of the device.

Turning now to the drawings drawn to a greatly exaggerated scale for clarity, and which will be discussed simultaneously since the method involves a plurality of serially employed steps, there is shown in FIGURE 1 a substrate 10 of suitable heat resistant electrically insulating material such as glass. A semiconductor material layer 12, e.g., cadmium sulfide, selenide or tellurium ~.5μ thick is deposited on the glass as by vacuum vapor deposition through a suitable apertured mask, not shown. Oppositely disposed conductive contacts 14 of conductive material such as gold may be utilized hereinafter as the interconnecting means for applying suitable energizing potentials to the device.

Figure 3:
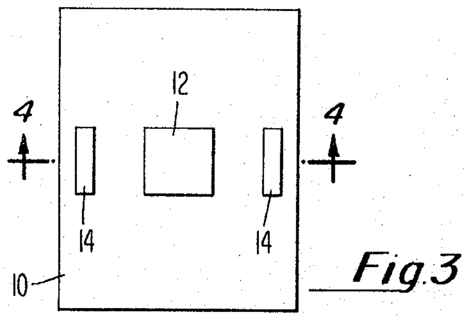
FIGURE 3 is a plan view of the substrate of FIGURE 1 with the connecting pads thereon.
Figure 4:
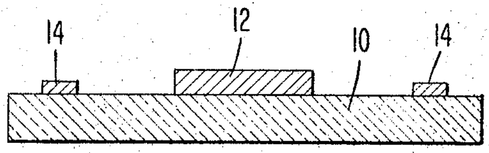
FIGURE 4 is a sectional view along the line 4—4 of FIGURE 1.
Figure 5:
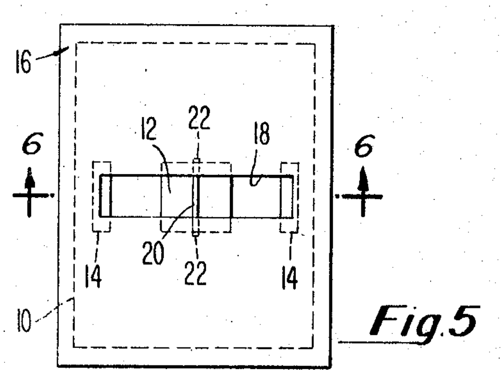
FIGURE 5 is a plan view of a wire supporting mask for the invention.
Figure 6:
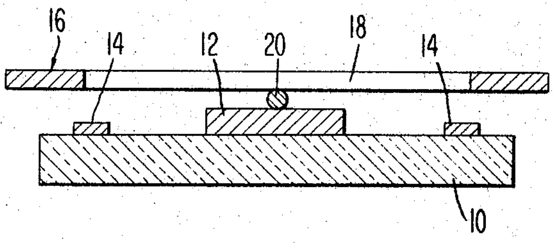
FIGURE 6 is a sectional view along the line 6—6 of FIGURE 5.
Figure 7:
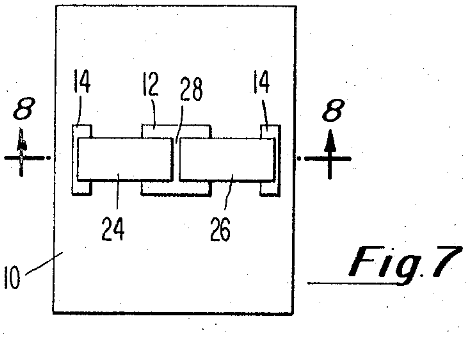
FIGURE 7 is a plan view of the source and drain electrodes.
Figure 8:
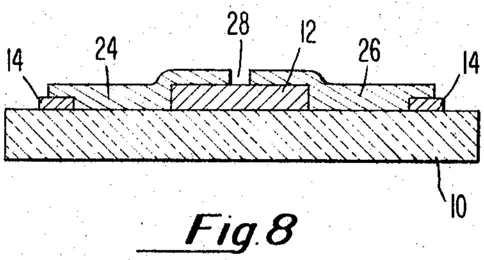
FIGURE 8 is a sectional view along the line 8—8 of FIGURE 7.

Thereafter, a mask 16, FIGURE 3, of rigid high heat resistant material, e.g., stainless steel, is provided with a rectangular opening 18 intermediate its ends and centrally across the shorter dimension (width) thereof. A short length of very fine wire 20, e.g. <10μ attached at its opposite ends to short posts 22 disposed on opposite sides of the opening 18, is stretched taut across the width of the opening 18. The mask 16, FIGURE 6, is positioned over the substrate 10 in such fashion that the wire 20 is substantially centered over the semiconductor 12. Source and drain electrodes 24 and 26, respectively, are then deposited through the mask so that the opposite ends of the source and the drain are in physical contact with the electrodes 14 on opposite sides of the substrate 10, while a narrow channel, slot or groove 28, FIGS. 7 and 8, is provided therebetween by means of the wire 20.

Figure 9:
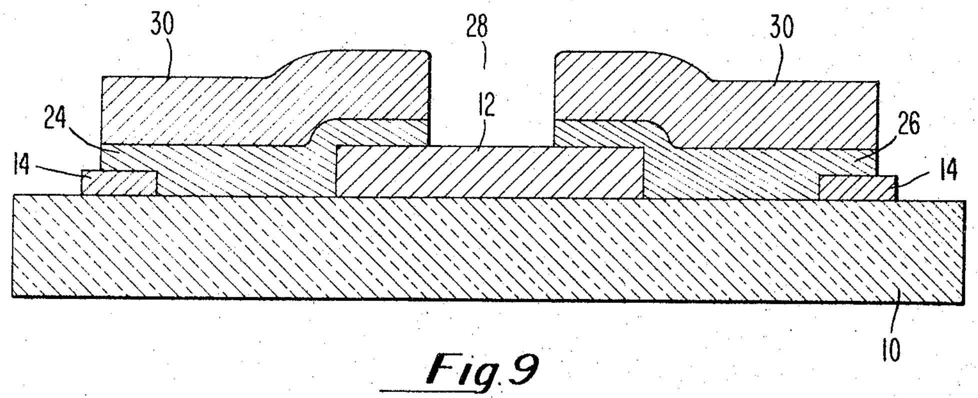
FIGURE 9 is a greatly enlarged sectional view of the apparatus with the large insulator in place.

With mask 16 still in place there is then evaporatively deposited a thick (greater than 1 micron) insulator 30—30 of SiO, calcium fluoride, etc., as seen in FIGURE 9. This deposit forms a rather large build-up layer over both the source 24 and the drain 26, leaving an extremely narrow channel or slot in register with the spacing 28 between the already deposited source and drain. Thereafter the mask 16 is removed. A relatively thin insulating layer 32 ∼.1 micron is deposited within the slot 28 in a manner tending to overlap the inward edge portions 34 of the thicker insulator 30—30 but in contact with the semiconductor 12 and the confronting face portions of the source and drain 24 and 26 at the side walls of the thicker insulator as seen in FIGURE 11.

Figure 11:
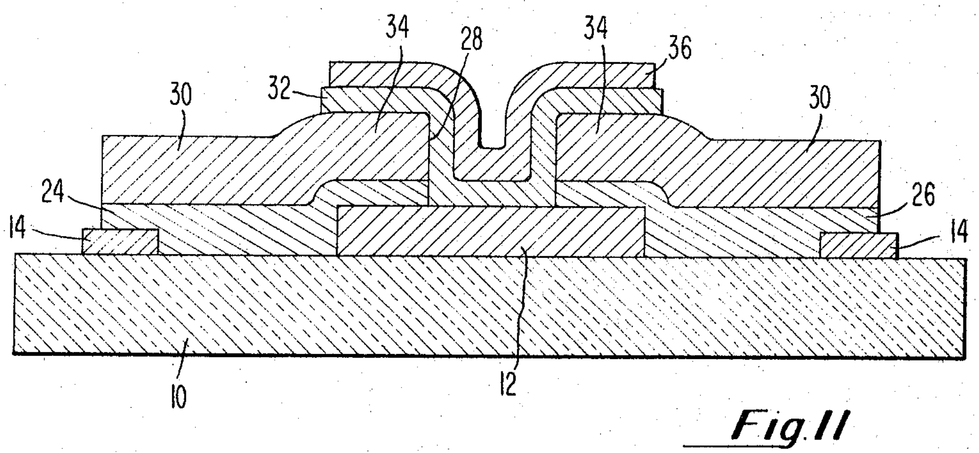
FIGURE 11 is a greatly enlarged sectional view along the line 11—11 of FIGURE 10.
Figure 10:
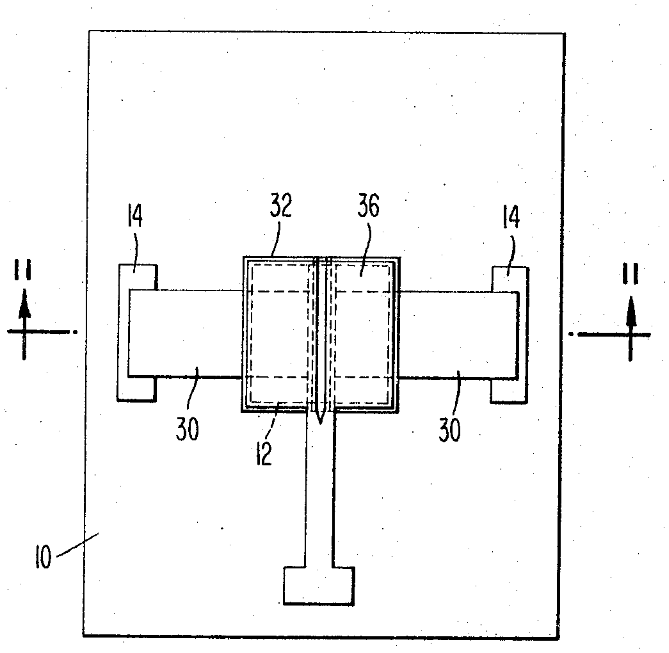
FIGURE 10 is a plan view of a device embodying the invention.

Finally a gate electrode 36 of the thickness ∼.1 micron is deposited in the slot 28 so as to be in surface contact with the insulator 32 as seen in the sectional view of FIGURE 11 and so as to follow the contour of the slotted outline of the space 28 between the source and drain. In this fashion, the source and drain can be exceptionally closely spaced relative to each other and to the gate 36. Also the gate may overlap the source and drain considerably without serious effect on the device performance.

There has thus been described a novel and heretofore unknown method of fabricating thin film transistors which is relatively simple and extremely efficient.

What is claimed is:

1. A thin film transistor comprising:
(a) a body of semiconductor material ∼.5μ thick disposed on an insulating substrate,
(b) oppositely disposed source and drain electrodes disposed on said semiconductor material, said electrodes spaced from one another by an amount <10μ with opposite ends of the source and drain electrodes secured to attachment pads for connection to a utilization device,
(c) a relatively thick ≈9000 A. insulating layer disposed over said source and drain electrodes effective to space said insulator in registration with said source and drain electrodes,
(d) a relatively thin ≈1000 A. insulating layer covering a portion of said thick insulating layer and a portion of said source and drain and within the space therebetween, and
(e) a gate electrode disposed on said thin insulating layer so that said gate electrode follows the contour outline of said insulating layer and lies almost totally within the space between said source and drain electrodes with relatively little overlap on either side thereof.

2. Thin film transistor apparatus comprising:
(a) a body of semiconductor material ∼.5μ thick deposited on a glass substrate,
(b) oppositely disposed source and drain electrodes on said semiconductor material spaced from one another by an amount <10μ and with opposite ends of the source and drain electrodes secured for attachment to a utilization device,
(c) a relatively thick > than 1 micron insulating layer over said source and drain electrodes effective to space said insulator in register with said source and drain electrodes,
(d) a relatively thin ∼1 micron insulating layer over a portion of said thick insulating layer and a portion of said source and drain and within the space therebetween, and
(e) a gate electrode ∼.1 micron disposed on said thin insulating layer so that said gate electrode follows the contour outline of said insulating layer and lies almost totally within the space between said source and drain electrodes with relatively little overlap on either side thereof.

3. Thin film transistor apparatus comprising:
(a) a body of semiconductor material from the group of semiconductor materials consisting of cadmium sulfide, selenide, and teluride disposed on a dielectric substrate,
(b) oppositely disposed source and drain electrodes from the group of materials consisting of In, Al, Be and Cd on said semiconductor material effective to space said electrodes from one another a distance of from 0.4 to 0.05 mil with opposite ends of the source and drain electrodes secured to attachment pads for connection to a utilization device,
(c) a relatively thick insulating layer over the source and drain electrodes effective to bring said insulator in register with said source and drain electrodes,
(d) a relatively thin insulating layer over a portion of said thick insulating layer and a portion of said source and drain and within the space therebetween, and
(e) a gate electrode disposed on said thin insulating layer so that said gate electrode follows the contour outline of said insulating layer and lies substantially within the space between said source and drain electrodes with relatively little overlap on either side thereof.

4. Thin film transistor apparatus comprising:
(a) a body of semiconductor material disposed on a dielectric substrate,
(b) oppositely disposed source and drain electrodes on said semiconductor material with said electrodes spaced from one another by a distance of from 0.4 to 0.05 mil with opposite ends of the source and drain electrodes secured to attachment pads on said substrate,
(c) a relatively thick insulating layer over said source and drain electrodes effective to space said insulator from and register the same with said source and drain electrodes,
(d) a relatively thin insulating layer over a portion of said thick insulating layer and a portion of said source and drain and within the space therebetween, and
(e) a gate electrode on said thin insulating layer whereby said gate electrode follows the contour outline of said insulating layer and lies substantially within the space between said source and drain electrodes and a little overlap on either side thereof.

References Cited by the Examiner

P. Weiner: Proceedings of the I.R.E., June 1962 (pages 1462–1469 relied on).

P. Weiner: Physics of Thin Films, vol. 2, Academic Press, New York, 1964 (QC 183–$P_4$–C.2) (pages 159–1964 relied on).

JOHN W. HUCKERT, *Primary Examiner.*

M. EDLOW, *Assistant Examiner.*